US011913649B2

(12) United States Patent
Wild et al.

(10) Patent No.: US 11,913,649 B2
(45) Date of Patent: Feb. 27, 2024

(54) COOKING APPLIANCE

(71) Applicant: WELBILT DEUTSCHLAND GMBH, Herborn (DE)

(72) Inventors: Hannes Wild, Riegsee (DE); Herbert Fischhaber, Peißenberg (DE); Frank Schwebesch, Polling (DE)

(73) Assignee: WELBILT DEUTSCHLAND GMBH, Eglfing (DE)

( * ) Notice: Subject to any disclaimer, the term of this patent is extended or adjusted under 35 U.S.C. 154(b) by 1205 days.

(21) Appl. No.: 16/566,192

(22) Filed: Sep. 10, 2019

(65) Prior Publication Data
US 2020/0080783 A1 Mar. 12, 2020

(30) Foreign Application Priority Data
Sep. 11, 2018 (DE) .......................... 102018215434.1

(51) Int. Cl.
| A21B 3/00 | (2006.01) |
| F24C 15/00 | (2006.01) |
| H05K 7/20 | (2006.01) |
| A47J 27/14 | (2006.01) |
| A47J 36/32 | (2006.01) |
| G01D 11/24 | (2006.01) |
| F27D 21/02 | (2006.01) |
| F27D 19/00 | (2006.01) |

(52) U.S. Cl.
CPC ............. *F24C 15/006* (2013.01); *A21B 3/00* (2013.01); *A47J 27/14* (2013.01); *A47J 36/32* (2013.01); *G01D 11/245* (2013.01); *H05K 7/20154* (2013.01); *H05K 7/20172* (2013.01); *H05K 7/20436* (2013.01); *F27D 2019/0056* (2013.01); *F27D 2021/026* (2013.01)

(58) Field of Classification Search
CPC ................................ A21B 3/00; F24C 15/006
See application file for complete search history.

(56) References Cited

FOREIGN PATENT DOCUMENTS

| CN | 101256992 A | * | 9/2008 |
| CN | 102105747 A | * | 6/2011 |
| CN | 102573419 B | * | 5/2015 |
| DE | 10319176 A1 | | 11/2004 |

(Continued)

OTHER PUBLICATIONS

German Search Report dated Sep. 11, 2018 for German application No. 10 2018 215 434.1.

*Primary Examiner* — Jamel E Williams
(74) *Attorney, Agent, or Firm* — LOZA & LOZA, LLP; David S. Sarisky

(57) ABSTRACT

Cooking appliance, especially a commercial cooking appliance, comprising a housing in which a cooking chamber is arranged; at least one sensor device; and a cooling device for the sensor device, which sensor device comprises the following components: a cooling housing, in which the sensor device is arranged, a heat-conducting bridge, and at least one heat-dissipating member, which is arranged on a support, wherein the cooling housing is made of heat-conducting, preferably highly thermally conductive material, and in that the heat-conducting bridge is made of thermally conductive, preferably highly thermally conductive material which connects the cooling housing to the support made of thermally conductive, preferably highly thermally conductive material.

13 Claims, 6 Drawing Sheets

(56) References Cited

FOREIGN PATENT DOCUMENTS

| | | | |
|---|---|---|---|
| DE | 102004040557 A1 | * | 2/2006 |
| DE | 102004040557 A1 | | 2/2006 |
| DE | 102008001675 A1 | * | 11/2009 |
| DE | 102008001675 A1 | | 11/2009 |
| EP | 1628342 A1 | * | 2/2006 |
| JP | 2004221103 A | * | 8/2004 |
| WO | 2015185211 A2 | | 12/2015 |
| WO | 2017044876 A1 | | 3/2017 |
| WO | WO-2017044876 A1 | * | 3/2017 |

* cited by examiner

COOKING APPLIANCE

BACKGROUND

1. Field of the Disclosure

The disclosure relates to a cooking appliance, especially in the form of a commercial cooking appliance.

2. Discussion of the Background Art

Such a cooking appliance is known, for example, from DE 10 2004 040 557 A1. In the embodiment as shown in FIG. 3, this document describes arrangement of an electronic component of a cooking appliance on top of a head that is connected via a neck to the base of a cooling device comprising a plurality of cooling fins arranged on the base. In the embodiment shown in FIG. 3, this arrangement is surrounded by a channel, which is not connected to the base in a heat-conducting manner via the head and neck.

Another cooking appliance comprising both a camera and a cooling system is known from WO 2015/185211.

It is the object of the present disclosure to provide a cooking appliance allowing high cooling capacity and having simple and compact structure.

SUMMARY

Accordingly, a cooking appliance will be provided, especially in the form of a commercial cooking appliance. In this application, the term "cooking appliance" is to be understood throughout as both commercial and household cooking appliances and, in general, food treatment appliances which are able to perform both cold and hot food treatment and which may include, for example, hot air steamers, combi-steamers, automatic beverage dispensers, beverage mixers, microwave ovens and other food treatment appliances.

The cooking appliance according to the disclosure comprises a housing in which a cooking chamber is arranged. Conventionally, this cooking chamber can be opened and closed by means of an openable and closeable cooking chamber door.

In addition, the cooking appliance according to the disclosure comprises a sensor device which can be used especially to select, guide and/or monitor a cooking program for preparing food in the cooking chamber. An example of such a sensor device is a camera, especially in the form of a digital camera.

As such a sensor device heats up during operation, which can reduce efficiency thereof, the cooking appliance according to the disclosure additionally comprises a cooling device for the sensor device allowing consistent cooling of the sensor device such that it may be maintained within a temperature range that is suitable for optimum performance.

This cooling device may comprise a cooling housing made of thermally conductive, preferably highly thermally conductive material. The cooling housing may include a receiving chamber in which the sensor device may be installed. In an especially preferred embodiment, this receiving chamber may be closed by means of a removable lid after the sensor device has been inserted.

The cooling device also comprises a heat-conducting bridge, which is also made of thermally conductive material, preferably highly thermally conductive material. This heat-conducting bridge connects the cooling housing to a support, which is also made of thermally conductive material and is preferably made of highly thermally conductive material. This support may, for example, be a support plate, and may preferably be a cooling member. Herein, it is possible for the cooling member to be arranged either on the support or the support plate or in the support.

Finally, the cooling device may comprise at least one heat-dissipating member, which is preferably arranged directly on the at least one cooling member, so that the heat extracted by the cooling member of the sensor device can be dissipated.

The sensor device may be arranged at any suitable position in or on the appliance housing. Especially, it is also possible to arrange the sensor device in the cooking chamber, wherein, depending on the arrangement of the sensor device, the cooling device may be arranged at a suitable position in or on the appliance housing, which cooling device represents a compact and easy-to-handle component which, depending on the type of appliance, may be adapted in terms of its components so that installation in or on the appliance housing may smoothly be performed.

The structure of the cooking appliance according to the disclosure allows the sensor device (camera) to be removed from the cooling device, especially to locally separate them from each other, as the sensor (camera) is mounted at a position on the cooking appliance where the cooling device could not be accommodated.

Actually, from DE 10 2008 001 675 A1 a camera module having an image sensor chip and at least one Peltier cooler with a cooling surface is known. The image sensor chip is connected to the cooling surface of the Peltier cooler by at least one heat collecting member, whereas a housing surrounding the image sensor chip is not in thermally conductive communication with the Peltier cooler.

Finally, from DE 103 19 176 A1 a device is known for cooling a camera, comprising an image sensor and a processing unit. These members are thermally connected to one end of a device for conducting heat, which device in turn is in thermal communication with a heat sink. Neither in this arrangement, the housing surrounding the image sensor and the processing unit are thermally coupled to the heat sink.

For allowing a compact and adaptable structure of the cooling device, the components thereof may integrally be connected to each other or, alternatively, may be designed as separate components which may suitably be connected to each other. Welding, soldering or bonding techniques are conceivable.

Furthermore, in an especially preferred embodiment, it is possible to arrange the cooling housing in a mounting box, which may be made of a material having poor thermal conductivity, such as plastics, to protect the cooling housing from being heated by external heat flows, which, for example, may be generated by other heat-producing appliances in the kitchen. Furthermore, it is possible to protect all temperature-sensitive components of the cooking appliance of the disclosure against heat input from outside, e.g. from hot climate in the kitchen or from other appliances in the kitchen, by using additional insulation members.

In an especially preferred embodiment, it is possible to provide more than one cooling member, especially two cooling members, which may also be arranged at a distance from each other to become adapted to various structural conditions. Basically, it is of course also possible to provide a number larger than two of such cooling members, which may be adapted in regard of dimensions and arrangement thereof to the structural conditions of the respective cooking appliance.

For further improvement of heat conduction, a layer of conductive paste, thermal foil or even thermal adhesive may be provided between the cooling member(s) and the support in another preferred embodiment, for further improvement of cooling performance of the cooling device in accordance with the disclosure.

Such a layer of conductive paste, thermal foil and/or thermal adhesive may also be provided between the cooling member(s) and the heat-dissipating member.

In another particularly preferred embodiment, the cooling device according to the disclosure also comprises a fan, for example in the form of a fan blower, directed towards the heat-dissipating member such that the air flow generated by the fan can be directed towards the heat-dissipating member to efficiently dissipate the heat accumulated in the heat-dissipating member using this cooling air flow.

In another particularly preferred embodiment, it is possible for the fan to be associated to a cooling channel in which the heat-dissipating member may be accommodated. In this case, the cooler will directly be connected to the cooling channel aspirating cold air therefrom. This cold air may subsequently be directed even more selectively to the cooling member, especially to the cooling fins of this cooling member, using the guiding function of the cooling channel. After passing through the cooling member, where the cold air was warmed, it may be discharged via an end section of the cooling channel at a suitable position, resulting in further increase of cooling efficiency.

For example, the heat-dissipating member may comprise a plurality of cooling fins, which may be subdivided into two cooling fin blocks in a preferred embodiment, and may be located on a support plate, for example.

Depending on the type of appliance, it is also possible to arrange the heat-dissipating member symmetrically or asymmetrically with respect to the cooling member(s) to realize a highly efficient cooling system having high cooling capacity, depending on the structural and functional conditions of the cooking appliance in question.

Aluminum is a particularly preferred material having high thermal conductivity, for all components of the cooling device according to the disclosure.

The cooling members are preferably formed as Peltier coolers (TEC). Alternatively, it is also possible for the cooling member(s) to be formed as heat exchangers.

Further alternatively, the cooling members could be a water cooler.

The cooling device according to the disclosure is defined as being a self-contained apparatus.

In all example embodiments described above of the cooking appliance according to the disclosure and the cooling device according to the disclosure all necessary controllers, appliance controls and active connections, signal lines, connection cables and, if necessary, energy sources for the power supply will be provided, and any combinations thereof may be implemented.

BRIEF DESCRIPTION OF THE DRAWINGS

Further details, advantages and features of the disclosure will arise from the following description of example embodiments while reference will be made to the drawing, wherein.

DETAILED DESCRIPTION OF THE PREFERRED EMBODIMENT

Figure 1:
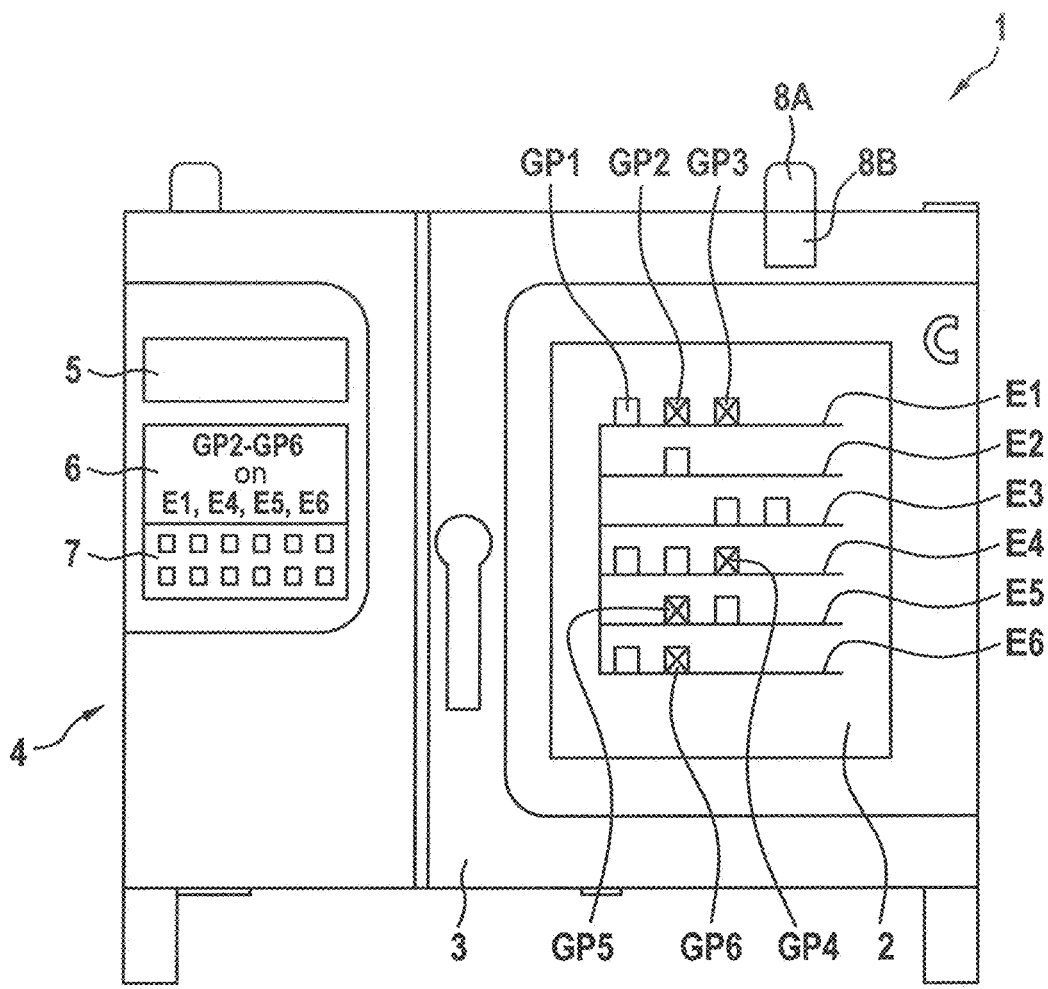
FIG. 1 shows a schematically simplified representation of an embodiment of a cooking appliance according to the disclosure.

FIG. 1 shows a cooking appliance 1 according to the disclosure having a cooking chamber 2, which is arranged in a housing or appliance housing 4. The cooking chamber 2 can be opened or closed via an openable and closable cooking chamber door 3.

The cooking appliance 1 also comprises a control device 5, a display device 6 and an input device 7.

Finally, the cooking appliance 1 is provided with a sensor device 8B, which is shown schematically simplified as a block in FIG. 1. As shown in FIG. 1, this sensor device 8B may be arranged in or on the housing 4, for example on the front side of housing 4. It is also possible to install the sensor device 8B in the cooking chamber door 3 or in cooking chamber 2 itself. An example of such a sensor device is a camera, especially in the form of a digital camera for monitoring the cooking chamber 2, for example a cooking process of cooking products GP1 to GP6, which may be arranged on the cooking trays E1 to E6.

The cooking appliance 1 according to the disclosure also comprises a cooling device 8A, which is also represented schematically and strongly simplified by a block, and in the embodiment shown in FIG. 1, for example, is arranged on the housing 4. However, this cooling device 8A may alternatively be placed in the housing 4, and therein will be placed in an area suitable for accommodating the cooling device 8A, or it may as well be provided in the cooking chamber door 3. This cooling device 8A is used to cool the sensor device 8B to ensure function and efficiency thereof.

The structure of the cooling device 8A will be explained below in detail in the FIGS. 2 to 4.

Figure 2:
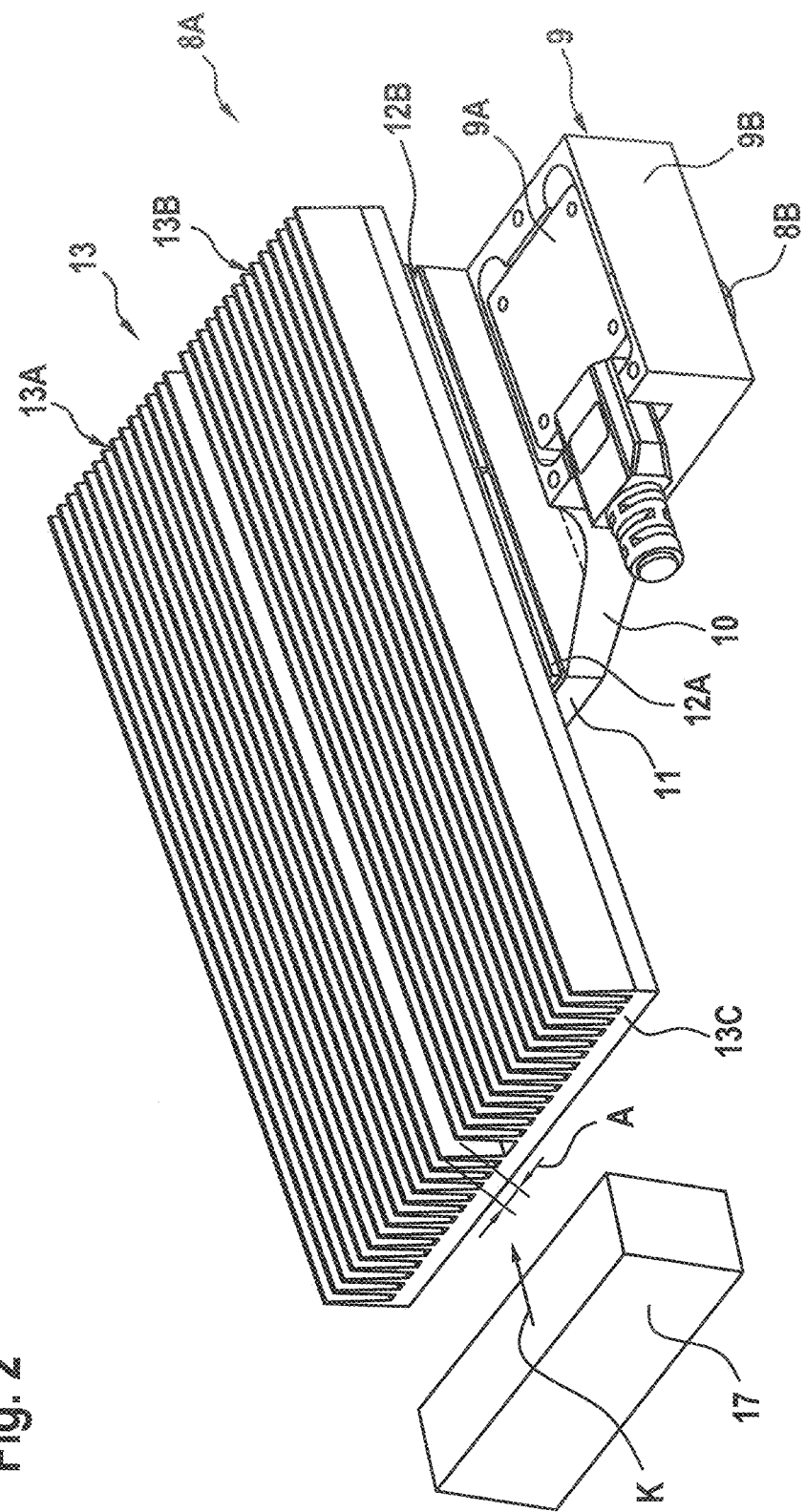
FIG. 2 shows a perspective representation of a first embodiment of the cooling device according to the disclosure.

The embodiment of the cooling device 8A according to FIG. 2 includes a cooling housing 9, which may be made of a preferably highly thermally conductive material, such as aluminum. The sensor device 8B is arranged in the cooling housing 9 in a receiving chamber not shown in FIG. 2, the lower part of which sensor device projects from the cooling housing 9 and may be seen in FIG. 2. The receiving chamber of the cooling housing 9 is closed with a lid 9A, which is fixed onto a housing body 9B.

The cooling housing 9 is connected to a heat-conducting bridge 10, which is also made of a thermally conductive, especially highly thermally conductive material. The heat-conducting bridges 10 connect the cooling housing 9 to a support 11, which is also made of thermally conductive material, preferably a highly thermally conductive material. The support 11, which is configured as a support plate in the embodiment shown, bears at least one cooling member, but in the embodiment shown, for example, two cooling members 12A and 12B are arranged on the support. These cooling members 12A and 12B may, for example, be designed as Peltier coolers.

Finally, the cooling device 8A comprises a heat-dissipating member 13, which is arranged on the two cooling members 12A and 12B, for example. Preferably, as explained above, this heat-dissipating member 13 is arranged directly on the cooling members 12A and 12B, and in a particularly preferred embodiment, it is possible to provide a layer of conductive paste, thermal foil or thermal adhesive between the cooling members 12A and 12B and the heat-dissipating member 13, but this layer may not be seen in FIG. 2, so that this layer will be explained in FIGS. 3 and 4.

As it is further illustrated in FIG. 2, in this embodiment, the heat dissipator 13 comprises two cooling fin blocks 13A and 13B arranged on a support plate 13C spaced apart from each other by a freely selectable distance.

Furthermore, the cooling device 8A of the type shown in FIG. 2 comprises a fan or blower 17 which can direct a cooling air flow K onto the cooling fin blocks 13A and 13B to dissipate the heat extracted from the sensor device 8B.

Figure 3:
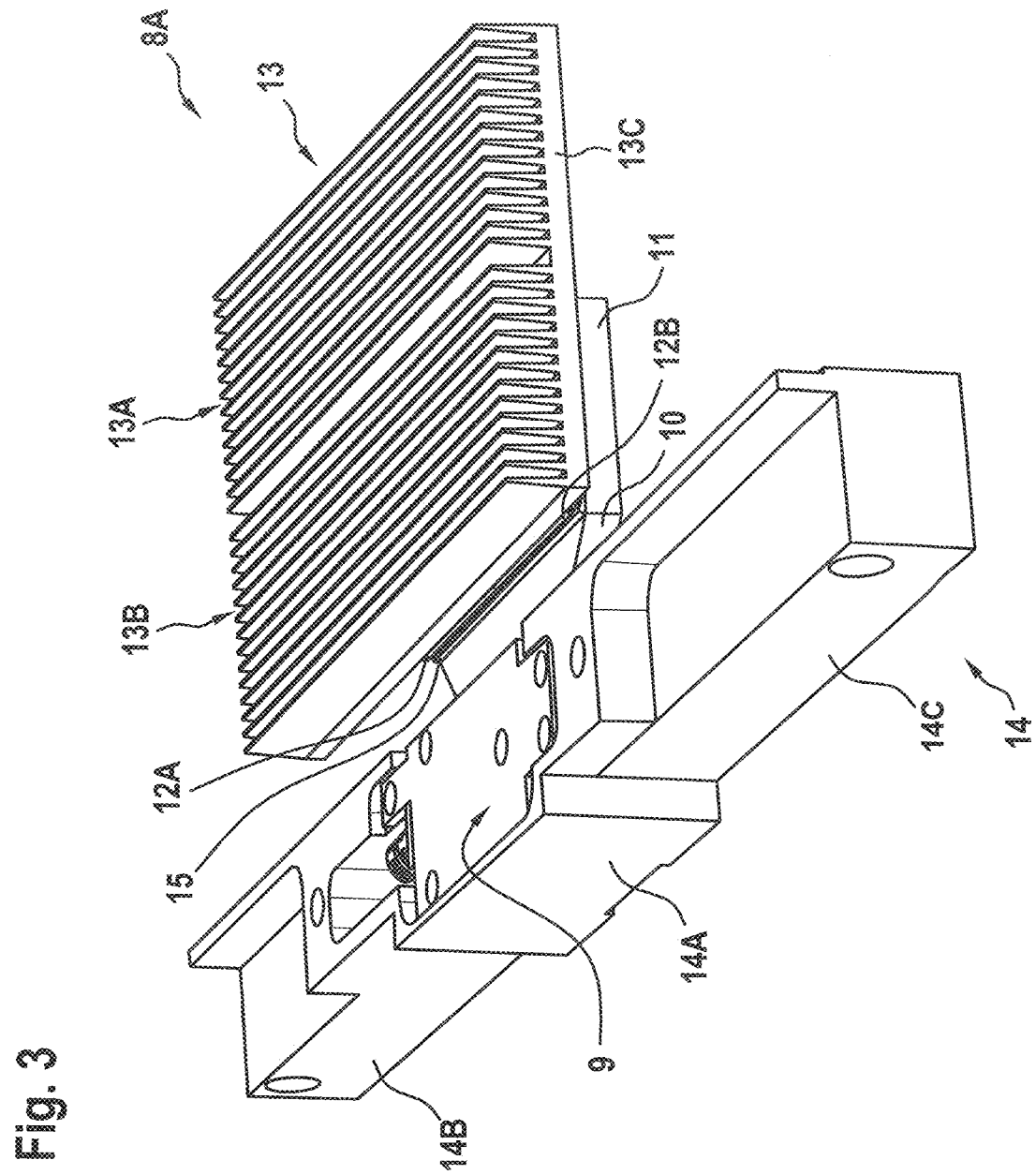
FIG. 3 shows a perspective representation of a second embodiment of the cooling device according to the disclosure.

In the embodiment according to FIG. 3, in addition to the components mentioned above of the cooling device 8A, a mounting box/external housing 14 is provided, which comprises a central receiving area 14A for the cooling housing 9B and two adjoining mounting sections 14B and 14C by which the cooling device 8A of this embodiment can be fixed in or on the housing 4B or inside the cooking chamber door 3. The mounting box 14 is made of a material, such as plastics, having poor thermal conductivity and is provided with further thermal insulation members, if required, such that the mounting box 14 is able to prevent heat from entering the cooling housing 9, for example in a kitchen where the cooking appliance 1 according to the disclosure is operated, resulting from other appliances or hot cooking vapors. The structure of the mounting box 14 shown in FIG. 3 is purely exemplary and may be adapted to the respective cooking appliance 1, regarding dimensions and shape thereof, so that the cooling device 8A may be arranged in or on the housing 4 or in the cooking chamber door 3.

FIG. 3 also shows a layer 15, which is the above-described layer of conductive paste, thermal foil or thermal adhesive, but which was not shown in FIG. 2.

Figure 4:
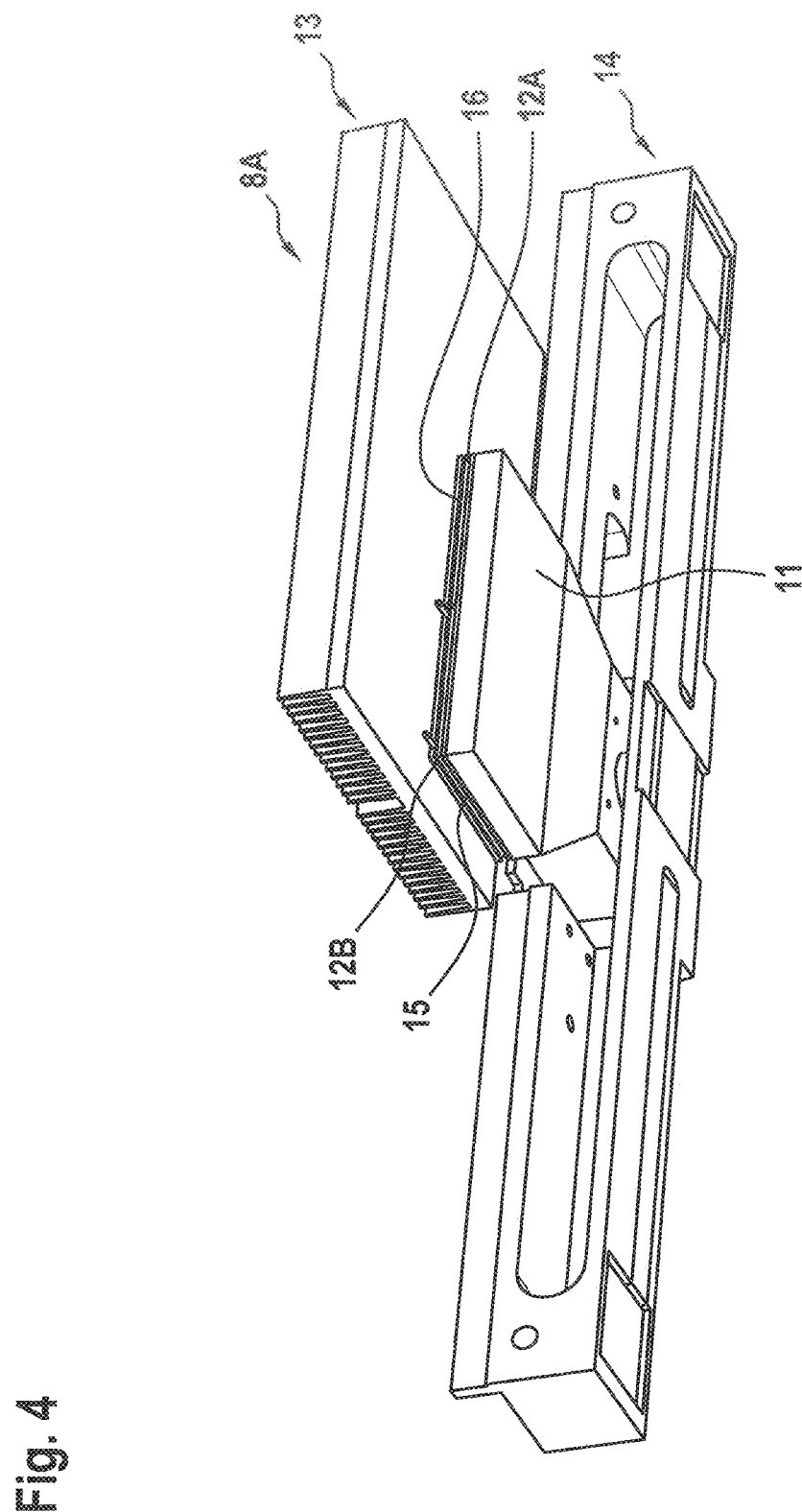
FIG. 4 shows a perspective bottom view of the embodiment of the cooling device according to FIG. 3.

FIG. 4 shows the bottom view of the embodiment according to FIG. 3, revealing that it is possible to provide two of such layers 15 and 16 of conductive paste, thermal foil or thermal adhesive, the layer 16 being provided between the cooling members 12A and 12B and the heat-dissipating member 13. Herein, it is also possible to provide a conductive paste, thermal foil or thermal adhesive between the camera or sensor device 8B and the cooling housing 9.

In the embodiment of the cooling device 8A as shown in FIGS. 3 and 4, the cooling device 8A may be combined with a fan 17, as schematically shown in FIG. 2. If a cooling air flow is available for cooking appliances, which cooling air flow may of course be generated without using such a fan 17, for example due to the structure of cooking appliance 1, it is not absolutely necessary for the cooling device 8A to make use of such a fan 17.

Figure 5:
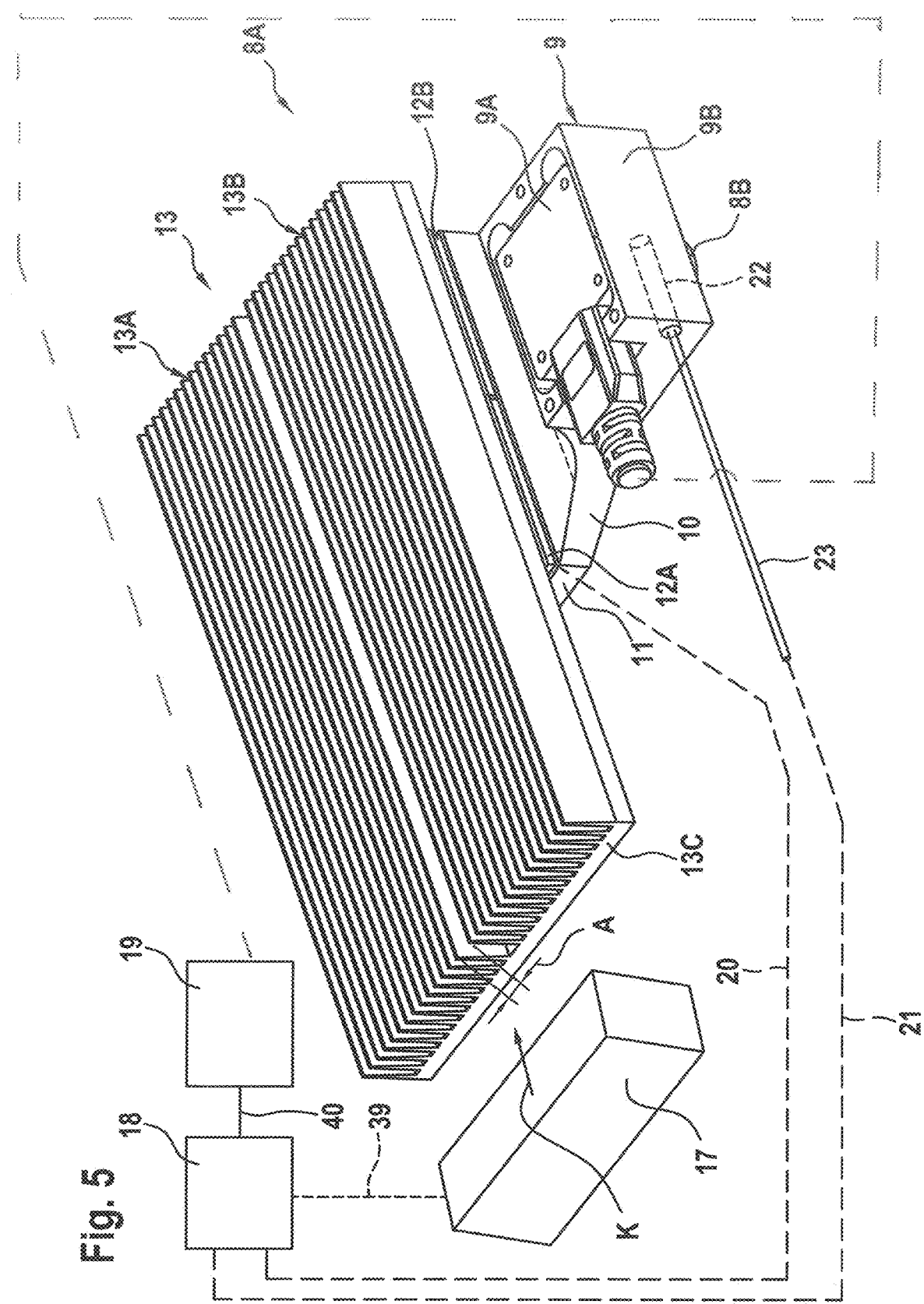
FIG. 5 shows a representation corresponding to FIG. 2 of the first embodiment of the cooling device according to the disclosure, which is supplemented with appropriate active lines and signal lines to exemplify provision of a controller and a device control as well as a temperature sensor.

FIG. 5 corresponds to the representation in FIG. 2, so that reference may be made to the previous description regarding all equal characteristics.

FIG. 5 shows an example of how the cooking appliance 1 according to the disclosure and the associated cooling device 8A, in addition to the components already described above, may of course be equipped with a controller 18 in every conceivable embodiment, which controller is operatively connected to an appliance control 19 via an active connection line 25.

The dashed lines 20 and 21 represent active connections between the controller 18 and the Peltier member(s) 12A or a sensor signal line to a temperature sensor 22, which is connected to the signal line 21 via a cable 23 and is arranged in the cooling housing 9. This temperature sensor 22 measures the internal temperature of the cooling housing 9 to monitor whether the sensor device 8B operates in a tolerable temperature environment or whether cooling activation is required to prevent overheating.

The Peltier coolers 12A, 12B may be controlled via line 20 if such coolers are provided as cooling members.

The connection line 39 between the controller 18 and the fan 17 allows switching the fan on or off.

Figure 6:
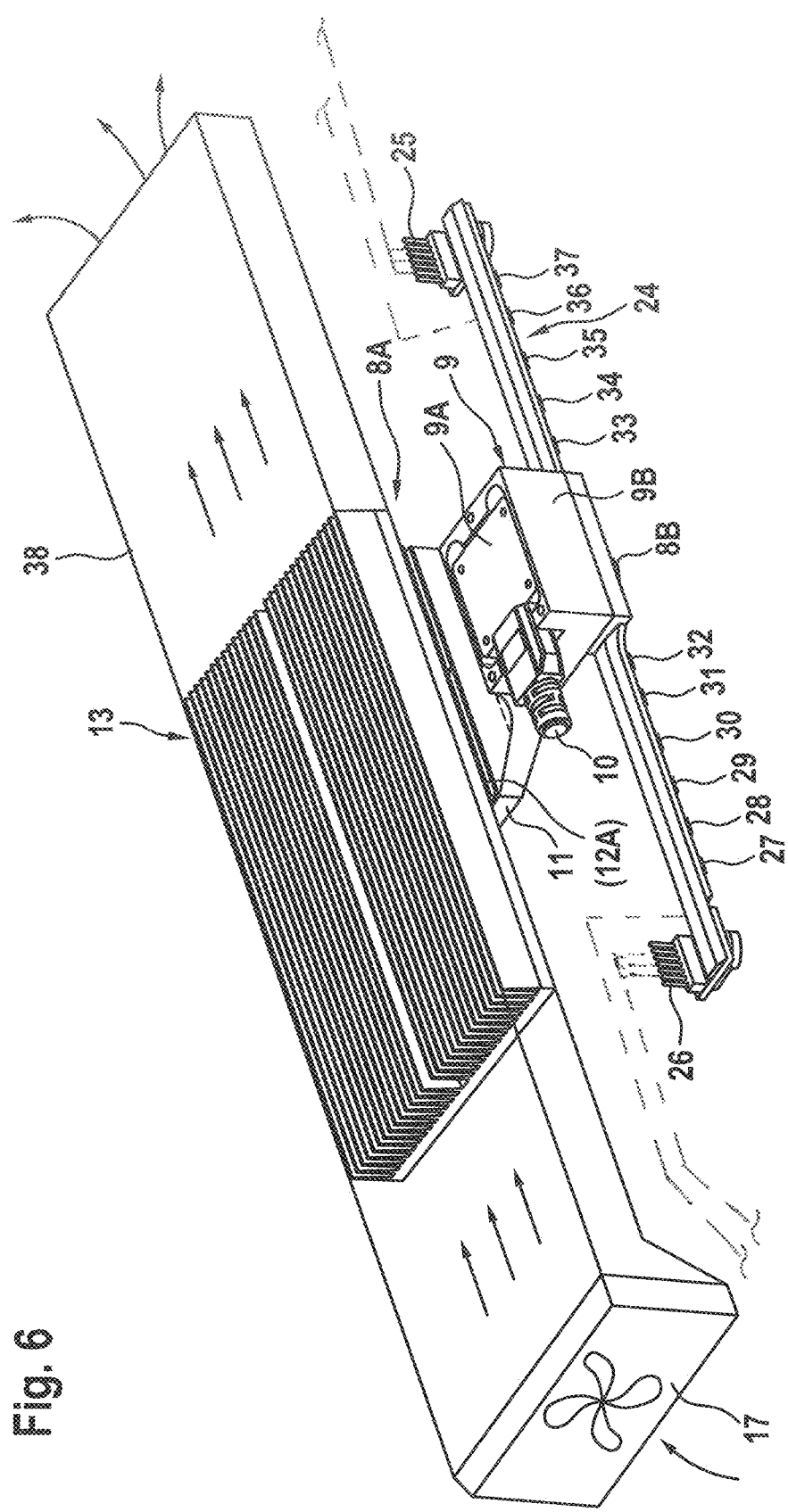
FIG. 6 shows another embodiment of the cooling device according to the disclosure.

FIG. 6 shows another embodiment of the cooling device 8A according to the disclosure. It essentially corresponds to the embodiment as shown in FIG. 2, so that reference may be made to the description thereof regarding all the equal features.

Another feature of this embodiment is a cooling bar 24, for example made of aluminum, which is connected to the cooling housing 9. Light sources, for example in the form of LEDs, may be provided underneath this cooling bar 24. They are symbolized in FIG. 6 by the reference signs 27 to 37.

In addition, two height sensors 25 and 26 are arranged at the two end sections of the cooling bar 24, allowing determination of the height at which food trays are introduced into the cooking chamber. The height sensors are of course connected to the controller 18 and controller 19, as explained above in FIG. 5, and the light sources can be switched on and off via the controller.

Furthermore, in this embodiment, it is possible to set different temperature zones via the geometry of the cooling bar 24, as in this direction, i.e. from the cooling housing 9 to the two height sensors 25 and 26 respectively, the temperature increases.

Moreover, the embodiment of FIG. 6 is characterised in that the fan or blower 17 interacts with a cooling channel 38. In the case of the embodiment shown, the fan 17 is arranged at the inlet of the cooling channel 38 and the heat-dissipating member 13 is arranged at a distance from the fan 17 in the cooling channel 38, as can be seen from the schematic diagram shown in FIG. 6.

Thus, in this embodiment it is possible to aspirate fresh air via the fan 17, conduct it in the cooling channel 38 via the heat-dissipating member 13 and, at the opposite end, dissipate the heated air in a suitable area inside or outside the cooking appliance 1 according to the disclosure. This further increases the efficiency of the cooling capacity of the cooling device 8A in accordance with the disclosure.

In this embodiment, it is also possible to omit one or more cooling members while providing the cooling bar 24, which is symbolized by the reference number 12A in brackets in FIG. 6. If necessary, combination of one or more cooling members 12A, 12B with the cooling bar 24 is also possible.

In addition to the above-mentioned written disclosure, reference will supplementary be made to the representation of the disclosure in FIGS. 1 to 6.

LIST OF REFERENCE NUMBERS 1 cooking appliance
2 cooking chamber
3 cooking chamber door 4 housing/appliance housing
5 control device
6 display device/display
7 input device/keyboard
8A cooling device
8B sensor device
E1 to E6 cooking trays
GP1 to GP6 cooking products
9 cooling housing
9A lid
9B housing body
10 heat-conducting bridge
11 support/support plate
12A, 12B cooling member
13 heat-dissipating member
13A, 13B cooling fin blocks
14 mounting box/external housing
14A recording area
14B, 14C mounting range
15, 16 layers
17 fan/blower
18 controller
19 device control
20, 21 active connection/signal connection
22 temperature sensor
23 cable
24 cooling bar
25, 26 height sensor
27-37 light sources/LEDs
38 cooling channel
39, 40 active connection/signal connection
K cooling air flow
A distance between cooling fin blocks 13A and 13B

What is claimed is:

1. A cooking appliance, especially a commercial cooking appliance, comprising:
    a housing in which a cooking chamber is arranged;
    at least one sensor device; and
    a cooling device for said sensor device, said cooling device comprising:
        a cooling housing in which the sensor device is arranged,
        a heat-conducting bridge, and
        at least one heat-dissipating member which is arranged on a support,
    wherein
        the cooling housing is made of thermally conductive, preferably a highly thermal conductive material,
        the heat-conducting bridge is made of thermally conductive, preferably a highly thermal conductive material and connects the cooling housing to the support made of thermally conductive, preferably a highly thermal conductive material,
        the support bears at least one cooling member, the at least one heat-dissipating member being arranged on the at least one cooling member, and
        the at least one cooling member is formed as a Peltier member or as a heat exchanger.

2. The cooking appliance according to claim 1, wherein the cooling housing, the heat-conducting bridge and the support are integrally formed or in that the cooling housing, the heat-conducting bridge and the support are separate components which are connected to each another.

3. The cooking appliance according to claim 1, wherein the cooling housing is arranged in a mounting box made of poorly thermally conductive material, wherein additional heat-insulating members are preferably provided in or around the cooling housing.

4. The cooking appliance according to claim 1, further comprising two cooling members are provided which are arranged at a distance from each another or which are arranged adjacent to each another.

5. The cooking appliance according to claim 1, further comprising a layer of conductive paste, thermal foil or heat-conducting adhesive between the at least one cooling member and the support.

6. The cooking appliance according to claim 1, further comprising a layer of conductive paste, thermal foil or heat-conducting adhesive between the at least one cooling member and the heat-dissipating member.

7. The cooking appliance according to claim 1, wherein the cooling device comprises a fan which is directed towards the heat-dissipating member and which is preferably arranged on an air channel or cooling channel in which the heat-dissipating member is placeable.

8. The cooking appliance according to claim 1, wherein the thermally conductive material is aluminum.

9. The cooking appliance according to claim 1, wherein the heat-dissipating member has a plurality of cooling fins.

10. The cooking appliance according to claim 9, wherein the cooling fins are divided into two cooling fin blocks.

11. The cooking appliance according to claim 9, wherein the cooling fins are arranged on a support plate.

12. The cooking appliance according to claim 1, wherein the heat-dissipating member is arranged symmetrically or asymmetrically with respect to the at least one cooling member.

13. A cooling device for a cooking appliance comprising:
    a cooling housing made of thermally conductive material, in which a sensor device is arranged;
    a heat-conducting bridge of thermally conductive material, which connects the cooling housing to a support of thermally conductive material, which bears at least one cooling member; and
    comprising at least one heat-dissipating member arranged on said at least one cooling member.

* * * * *